(12) United States Patent
Lee et al.

(10) Patent No.: US 8,551,821 B2
(45) Date of Patent: Oct. 8, 2013

(54) ENHANCEMENT NORMALLY OFF NITRIDE SEMICONDUCTOR DEVICE MANUFACTURING THE SAME

(75) Inventors: Jung Hee Lee, Daegu-Si (KR); Ki Sik Im, Daegu-Si (KR); Jong Bong Ha, Daegu-Si (KR)

(73) Assignee: Kyungpook National University Industry-Academic Cooperation Foundation, Daegu-si (KR)

( * ) Notice: Subject to any disclaimer, the term of this patent is extended or adjusted under 35 U.S.C. 154(b) by 0 days.

(21) Appl. No.: 12/960,499

(22) Filed: Dec. 4, 2010

(65) Prior Publication Data

US 2011/0140121 A1    Jun. 16, 2011

(30) Foreign Application Priority Data

Dec. 14, 2009  (KR) .................... 10-2009-0123987

(51) Int. Cl.
*H01L 21/335*    (2006.01)
*H01L 21/8232*    (2006.01)
*H01L 21/339*    (2006.01)
*H01L 21/00*    (2006.01)
*H01L 21/84*    (2006.01)

(52) U.S. Cl.
USPC ........... 438/142; 438/153; 438/154; 438/161; 438/167; 438/172; 257/E21.4; 257/E21.403; 257/E21.407; 257/E21.419

(58) Field of Classification Search
USPC ........ 257/E21.4, E21.403, E21.407, E21.419
See application file for complete search history.

(56) References Cited

U.S. PATENT DOCUMENTS

| | | | | |
|---|---|---|---|---|
| 2008/0087917 A1* | 4/2008 | Briere | ........................... | 257/194 |
| 2010/0314695 A1* | 12/2010 | Bol | ............................... | 257/409 |
| 2011/0006346 A1* | 1/2011 | Ando et al. | .................... | 257/192 |
| 2011/0133205 A1* | 6/2011 | Nagahisa et al. | ............... | 257/76 |

FOREIGN PATENT DOCUMENTS

WO    WO 2009113612 A1 *  9/2009

\* cited by examiner

*Primary Examiner* — Mohsen Ahmadi
(74) *Attorney, Agent, or Firm* — Revolution IP, PLLC

(57) ABSTRACT

The present invention relates to an enhancement normally off nitride semiconductor device and a method of manufacturing the same. The method includes the steps of: forming a buffer layer on a substrate; forming a first nitride semiconductor layer on the buffer layer; forming a second nitride semiconductor layer on the first nitride semiconductor layer; etching a gate region above the second nitride semiconductor layer up to a predetermined depth of the first nitride semiconductor layer; forming an insulating film on the etched region and the second nitride semiconductor layer; patterning a source/drain region, etching the insulating film in the source/drain region, and forming electrodes in the source/drain region; and forming a gate electrode on the insulating film in the gate region. In this manner, the present invention provides a method of easily implementing a normally off enhancement semiconductor device by originally blocking 2DEG which is generated under a gate region. In addition, the present invention provides an enhancement normally off power semiconductor device with a simple and efficient driving circuit in a HEMT device.

5 Claims, 5 Drawing Sheets

ENHANCEMENT NORMALLY OFF NITRIDE SEMICONDUCTOR DEVICE MANUFACTURING THE SAME

TECHNICAL FIELD

The present invention relates to a nitride semiconductor device and a method of manufacturing the same, and more particularly, to an enhancement normally off nitride semiconductor device and a method of manufacturing the device easily using a selective etching and a masking barrier.

BACKGROUND ART

HEMT (high electron mobility transistor) is one example of traditional power semiconductor devices. HEMT is manufactured using a III group nitride semiconductor, which means semiconductor alloyed metal from GaN, AlGaN, InGaN or AlInGaN system, as mentioned in this specification.

As known in the traditional art, HEMT includes a first III group nitride semiconductor body composed of, for example, undoped GaN, and a second III group semiconductor body which is arranged on the first III group nitride semiconductor body and is composed of, for example, AlGaN.

As well known in the art, hetero-junction between the first III group nitride semiconductor body and the second III group nitride semiconductor body generally forms a conductive region which is also referred to as "two-dimensional electron gas (2DEG)." Typical HEMT further includes at least two power electrodes. Current flows between the two power electrodes through the 2DEG.

HEMT further includes a gate arrangement which is operable to activate or deactivate the 2DEG as desired, thereby turning on or off the HEMT. As a result, HEMT may act as a field effect transistor (FET). In fact, this HEMT is also referred to as "hetero-junction field effect transistor (HFET)."

III group nitride-based hetero-junction power semiconductor devices having high current transporting capability and high breakdown voltage capability are adaptable for power applications because of their low power loss. However, a III group nitride semiconductor device is generally of a normally on type, which means that a bias is required to be applied to a gate electrode to turn off this device.

Normally on devices are less preferable for power applications, because (a) these devices are operated with less efficiency than normally off devices and (b) driving circuits for the normally on devices are complicated and expensive. Thus, there is a need to provide a normally off III group nitride power semiconductor device.

An AlGaN/GaN hetero-junction structure is used for a high power field effect transistor which controls a flow of source-drain current through a gate voltage using 2DEG at an AlGaN/GaN interface. This 2DEG is generated according to a polarization effect by which negative charges are generated below an AlGaN surface. These negative charges are very sensitive to the surrounding environments, which results in fluctuation of the source-drain current.

DISCLOSURE OF INVENTION

Technical Problem

The present invention has been designed to overcome the above and other problems, and it is an object of the invention to provide a method of easily manufacturing a normally off nitride power semiconductor device which is efficient, simple in its driving circuit, and low in its production costs, by removing two-dimensional electron gas (2DEG) which is generated near an interface between nitride semiconductor layers having different band gaps.

Technical Solution

To achieve the above and other objects, according to a first aspect, the present invention provides a method of manufacturing a normally off nitride semiconductor device, including the steps of: forming a buffer layer on a substrate; forming a first nitride semiconductor layer on the buffer layer; forming a second nitride semiconductor layer on the first nitride semiconductor layer; etching a gate region above the second nitride semiconductor layer up to a predetermined depth of the first nitride semiconductor layer; forming an insulating film on the etched region and the second nitride semiconductor layer; patterning a source/drain region, etching the insulating film in the source/drain region, and forming electrodes in the source/drain region; and forming a gate electrode on the insulating film in the gate region.

Preferably, the first nitride semiconductor layer is a highly resistive GaN layer, the second nitride semiconductor layer is an AlGaN layer, and the first nitride semiconductor layer and the second nitride semiconductor layer are formed using a MOCVD method. In addition, preferably, the insulating film is made of one selected from the group consisting of $Al_2O_3$, $HfO_2$ and $SiO_2$.

Preferably, the step of etching a gate region includes completely removing the second nitride semiconductor layer in the gate region, and adjusting a threshold voltage depending on a recess depth as the first nitride semiconductor layer is etched.

According to a second aspect, the present invention provides a method of manufacturing a normally off nitride semiconductor device, including the steps of: forming a buffer layer on a substrate; forming a first nitride semiconductor layer on the buffer layer; patterning a masking barrier in a gate region above the first nitride semiconductor layer; forming a second nitride semiconductor layer at sides, with the masking barrier interposed between the first nitride semiconductor layer and the second nitride semiconductor layer; removing the masking barrier; forming an insulating film on the second nitride semiconductor layer and a layer where the masking barrier is removed; patterning a source/drain region, etching the insulating film in the source/drain region, and forming electrodes in the source/drain region; and forming a gate electrode on the insulating film in the gate region.

Preferably, the first nitride semiconductor layer is a highly resistive GaN layer, the second nitride semiconductor layer is an AlGaN layer, and the first nitride semiconductor layer and the second nitride semiconductor layer are formed using a MOCVD method.

In addition, preferably, the insulating film is made of one selected from the group consisting of $Al_2O_3$, $HfO_2$ and $SiO_2$, and the masking barrier is made of $SiO_2$. According to another aspect, the present invention provides a normally off nitride semiconductor device manufactured according to the above-described method.

Advantageous Effects

In this manner, the present invention provides a method of easily implementing a normally off enhancement semiconductor device by removing a hetero-junction layer with selective etching or a masking barrier below a gate region, thereby originally blocking 2DEG which is generated by the heterojunction between nitride semiconductor layers having different band gaps. In addition, the present invention provides an enhancement normally off power semiconductor device with a simple driving circuit.

BEST MODE FOR CARRYING OUT THE INVENTION

Hereinafter, preferred embodiments of the present invention will be described in detail with reference to the accompanying drawings.

Figure 3:
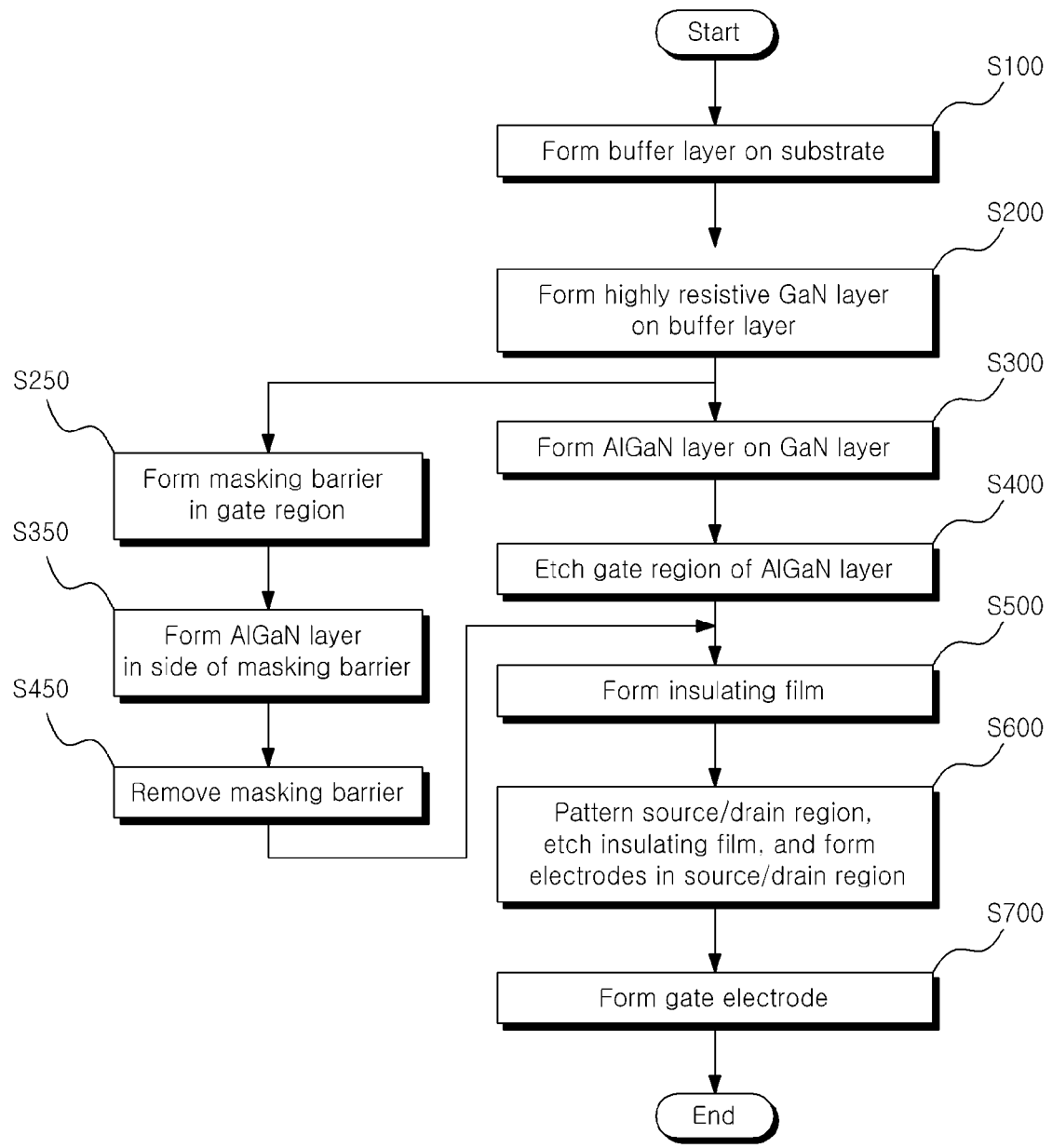
FIG. 3 is a flow diagram showing processes of manufacturing the normally off nitride semiconductor device according to an embodiment of the present invention.

FIG. 1 (1a to 1f) is a view showing processes of manufacturing a normally off nitride semiconductor device according to an embodiment of the present invention, and FIG. 3 is a flow diagram showing processes of manufacturing the normally off nitride semiconductor device according to an embodiment of the present invention. Hereinafter, preferred embodiments of the present invention will be described in detail with reference to FIGS. 1 and 3.

A method of manufacturing a normally off nitride semiconductor device according to an embodiment of the present invention generally includes a step (S100) of forming a buffer layer 20 on a substrate 10; a step (S200) of forming a first nitride semiconductor layer 30 on the buffer layer 20; a step (S300) of forming a second nitride semiconductor layer 40 on the first nitride semiconductor layer 30; a step (S400) of etching a gate region on the second nitride semiconductor layer 40 up to a depth of the first nitride semiconductor layer 30; a step (S500) of forming an insulating film 45 on the etched gate region and the second nitride semiconductor layer 40; a step (S600) of patterning a source/drain region, etching the insulating film 45 of the source/drain region and forming source/drain electrodes 50 and 60 in the source/drain region; and a step (S700) of forming a gate electrode 70 on the insulating film 45 in the gate region.

Figure 1A:
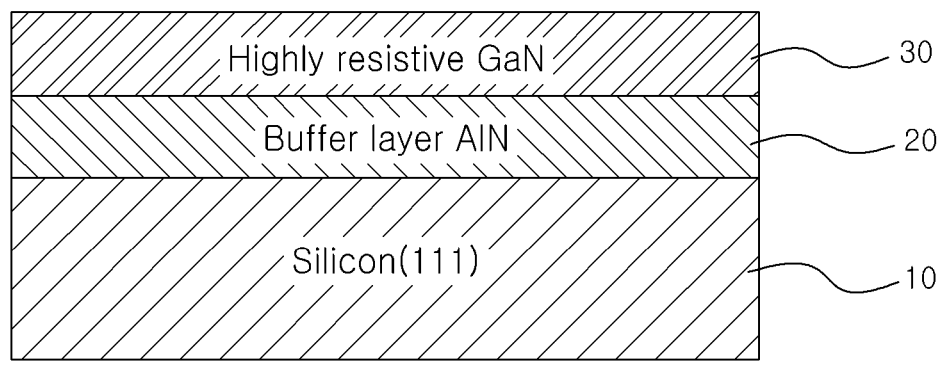
FIG. 1 (1a to 1f) is a view showing processes of manufacturing a normally off nitride power semiconductor device according to an embodiment of the present invention.

Referring to FIG. 1a, the buffer layer 20 made of AlN is first formed on the substrate 10 and serves to lower an interface stress in order to grow a nitride semiconductor layer. Of course, a low-temperature GaN layer is also possible. Then, a gallium nitride (GaN) layer 30 as a first semiconductor layer is grown on the buffer layer 20 using a MOCVD method. (S200)

In this embodiment, the gallium nitride (GaN) layer 30 is a highly resistive semiconductor layer on which a second nitride semiconductor layer 40 is grown to form a two-dimensional electron gas (2DEG) layer 35.

Figure 1B:
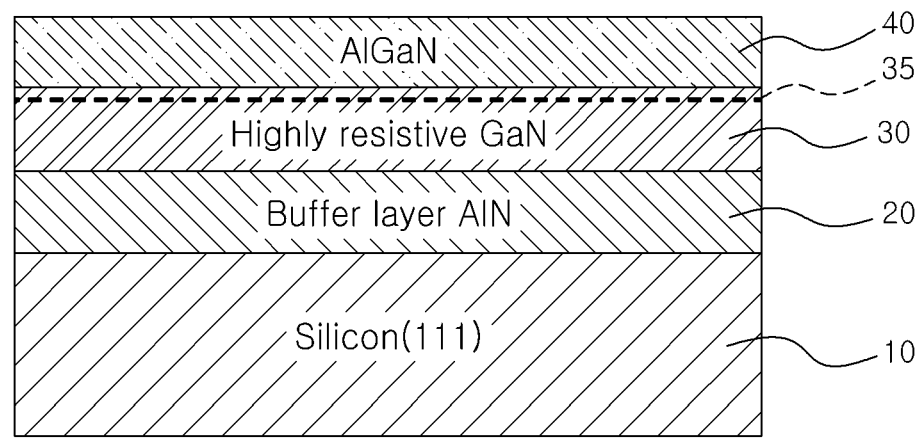

Then, as shown in FIG. 1b, an AlGaN layer 40 containing aluminum, which is the second nitride semiconductor layer 40 having a band gap different from that of the GaN layer 30, makes hetero-junction with the highly-resistive gallium nitride layer 30. (S300) Such hetero-junction between these two semiconductor materials having different band gaps forms two-dimensional electron gas (2DEG) 35.

In this embodiment, it is preferable that the GaN layer 30 and the AlGaN layer 40 are continuously epitaxially grown using MOCVD. MOCVD is an epitaxy method to grow a semiconductor film on the substrate 10 using a gas pyrolysis reaction of organic metal compound and hydride, which has been developed from its beginning with GaAs film growth at 1968 and has its current wide application to semiconductor growth. In particular, MOCVD has been applied to synthesis of various low-dimensional nanostructures in addition to a 3-dimensional epitaxy process since unique characteristics different from those of general bulk structures are discovered in several tens-sized low dimensional materials manufactured using MOCVD at 1982.

Epitaxial growth of GaN using MOCVD involves use of a two-phase growth method of growing the GaN buffer layer (AlN) 20 on the sapphire substrate 10 and again growing the GaN epitaxial layer 30 thereon, as described above, in order to alleviate the lattice mismatch between the substrate 10 such as Si, SiC, sapphire or the like and the GaN epitaxial layer 30.

The two-phase growth method is a method of subjecting the GaN buffer layer (AlN) 20 to thermal etching at epitaxial layer growth temperature (1100° C.) or more, growing the GaN buffer layer 20 near 550° C., and growing the GaN epitaxial layer 30 at 1050° C. or more. In this way, the MOCVD method has the merit of high partial pressure and good decomposition (at low temperature) of a source of reactant gas (such as an organic metal precursor) used for film formation reaction, thereby allowing smooth supply of reactant gas for film deposition. In addition, this method uses a high-purified refined source of reactant gas to provide good characteristics of thin films to be grown.

In addition, the 2DEG 35 is an accumulative layer within an undoped material having a smaller band gap and may have a very high concentration of excessive sheet electrons. In addition, electrons emitted from a semiconductor having a larger band gap exhibit high electron mobility and move to the 2DEG 35 since scattering of ionized impurities is decreased.

Such combination of high carrier concentration and high carrier mobility can grant very high transconductance to HEMT and can provide an advantage of more powerful performance over a metal-semiconductor field effect transistor in high frequency applications.

However, although HEMTs or III group nitride-based hetero-junction power semiconductor devices having high current transporting capability and high breakdown voltage capability are adaptable for power applications because of their low power loss, many III group nitride semiconductor devices are generally of a normally on type, which means that a bias is required to be applied to a gate electrode to turn off this device, which may result in low efficiency in terms of power.

On the contrary, the present invention suggests a method of easily manufacturing a structure to recover the 2DEG 35 only when a bias is applied to the gate electrode 70, by originally blocking formation of the 2DEG 35 below the gate electrode 70 in order to implement a normally off device in the nitride HEMT device using a simple manufacturing process.

Figure 1C:
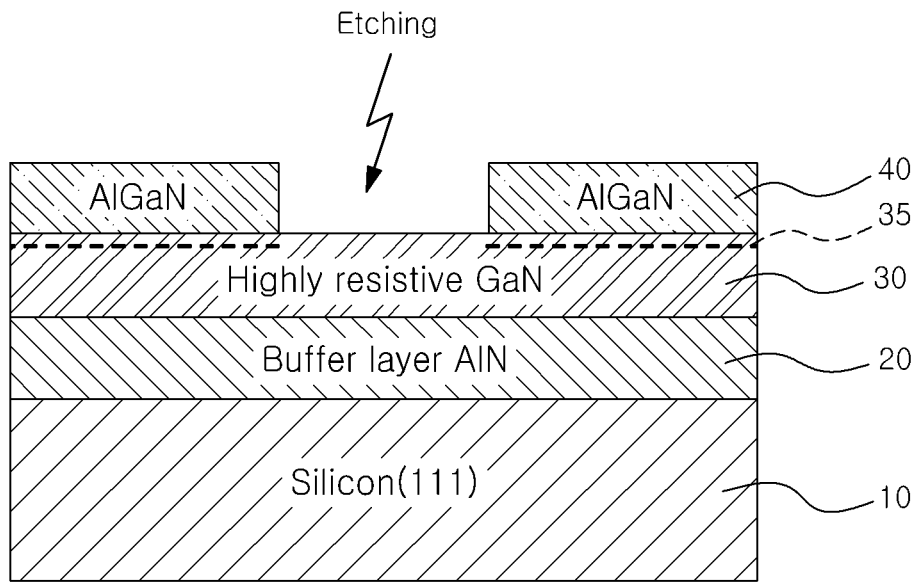

As shown in FIG. 1c, since the 2DEG 35 is generated by a polarization effect at an interface of hetero-junction between the GaN layer 30 and the AlGaN layer 40 which have different band gaps, formation of the 2DEG 35 is originally blocked by etching a portion of the AlGaN layer 40 below the gate region of the AlGaN layer 40 which is the second nitride semiconductor layer 40 epitaxially grown on the GaN layer which is the first nitride semiconductor layer 30. (S400) Then, the 2DEG 35 formed near the interface is formed only below the source/drain electrodes 50 and 60 regions without being formed below the gate electrode 70 region, thereby allowing formation of a normally off semiconductor device.

In addition, preferably, the etching step can completely remove the AlGaN layer, which is the second nitride semiconductor layer in the gate region, and adjust a threshold voltage depending on a recess depth as the highly resistive GaN layer, which is the first nitride semiconductor layer, is etched. That is, the present invention has the merit that the above-described structure easily controls the threshold voltage in the nitride semiconductor and facilitates a customized design.

Figure 1D:
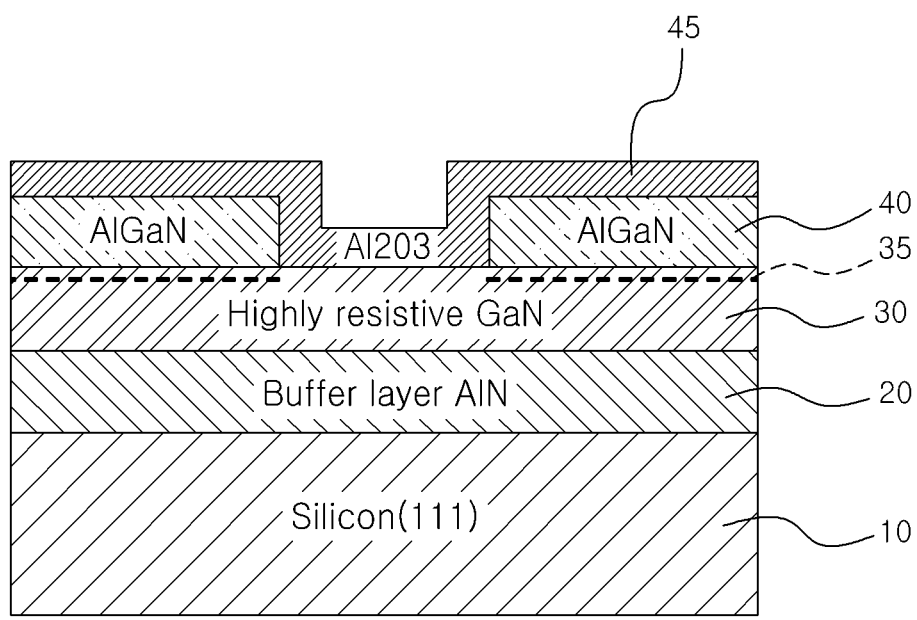

Then, as shown in FIG. 1d, an insulating film 45 to insulate the channel region GaN layer 30 from the gate electrode 70 (metal) to apply a bias is formed on the AlGaN layer 40 and the GaN layer 30. (S500) Here, the insulating film 45 is preferably made of one of $Al_2O_3$, $SiO_2$, $HfO_2$, etc. However, it should be understood that any material is also possible as long as it has high insulating property and can be used to form the insulating film. In this case, characteristics of the device depend on the thickness and dielectric constant of the insulating film 45. Larger thickness and higher dielectric constant of the insulating film 45 may provide more gate leakage and higher voltage to the gate electrode 70.

Figure 1E:
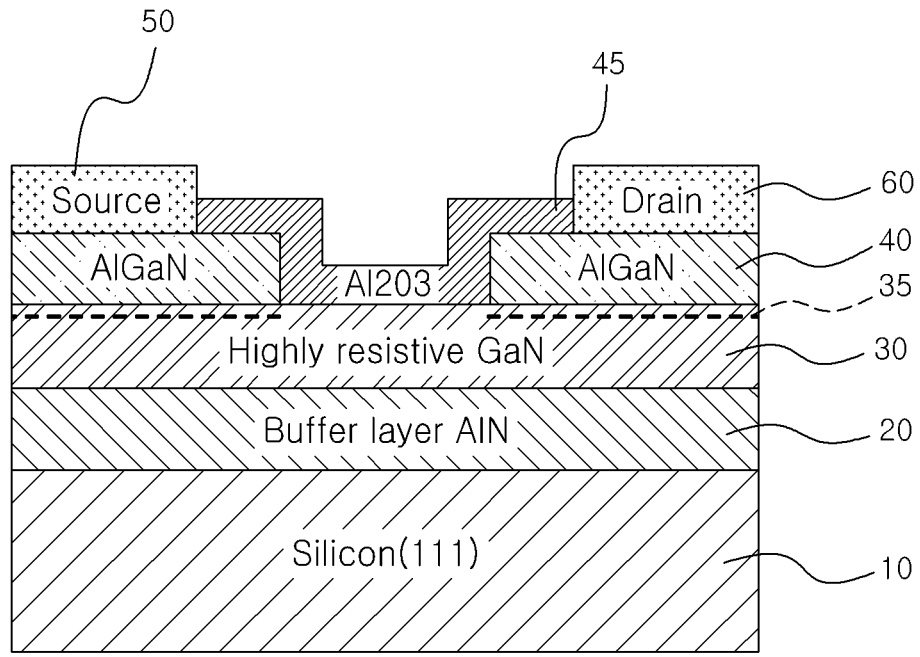

As shown in FIG. 1e, a portion of the source/drain region for measurement of the semiconductor device is patterned, and then the insulating film 45 ($Al_2O_3$) deposited on the AlGaN layer 40 in the source/drain region is etched away. Then, electrodes are formed in the source/drain region with the insulating film etched away. (S600) In this case, material used for the electrodes is preferably metal or alloyed metal having high conductivity, for example, Ta, Ti, Al, Ni, Au or a combination thereof.

In general, the source/drain electrodes 50 and 60 in a FET device are commonly made of an alloy to allow ohmic contact with the GaN layer 30, resulting in reduction of a difference in work function between both contacting metals.

The ohmic contact means low contact resistance between electrode metal and a semiconductor, which has little effect by electrode metal on characteristics of the semiconductor device when metal wires are drawn out of the semiconductor device. However, in general, when metal contacts a semiconductor with low impurity concentration, good ohmic contact can not be expected since a potential barrier is formed in a contact surface. In principle, since the height of the potential barrier is determined based on a difference in work function between metal and a semiconductor, appropriate metal should be selected such that a potential barrier to carriers (electrons and holes moving in the semiconductor) is not formed.

Assuming that a work function of metal is fm and a work function of a semiconductor is fs, there occurs no potential barrier to carriers by selecting a combination of fm<fs for an n-type semiconductor and fm>fs for a p-type semiconductor. Therefore, in the present invention, by forming an ion doping layer at a constant depth below the interface to lower a potential barrier between the semiconductor (AlGaN) and the metal, the work function difference therebetween can be reduced tot achieve ohmic contact.

Figure 1F:
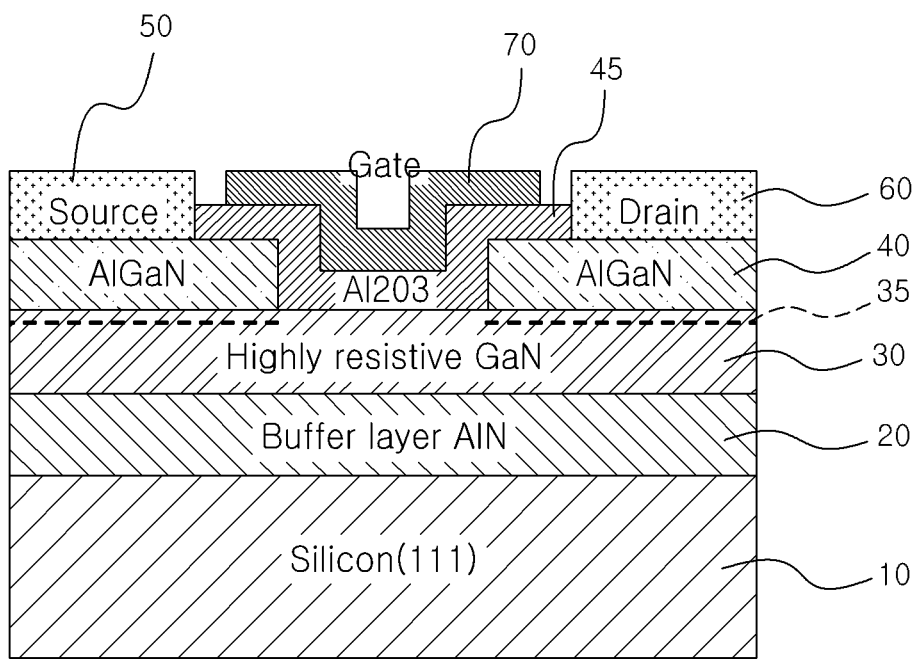

Finally, as shown in FIG. 1f, a gate region to apply a bias to the top of the exposed insulating film 45 is patterned and deposited with metal to complete the gate electrode 70. (S700) In this case, the metal used is preferably metal or alloyed metal having high conductivity, for example, at least one of Ta, Ti, Al, Ni, Au or a combination thereof since the gate electrode 70 generally makes Shottky contact unlike the source/drain electrodes 50 and 60.

Figure 2:
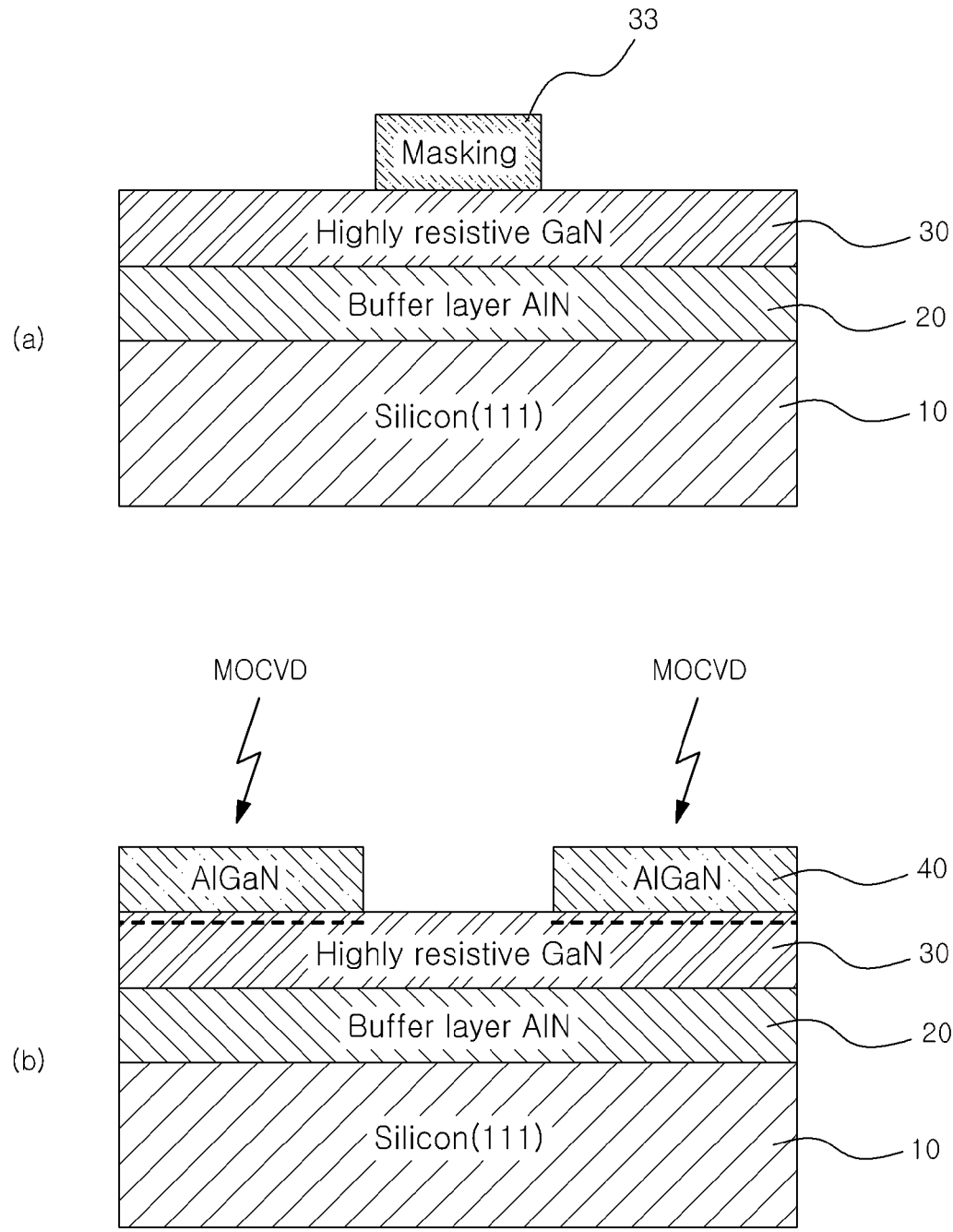
FIG. 2 is a view showing a part of processes different from the processes of manufacturing the normally off nitride power semiconductor device shown in FIG. 1.

FIG. 2 is a view illustrating processes of the method of manufacturing the normally off nitride semiconductor device, with some of the processes different from those of FIG. 1 and with the remaining same as or similar to those of FIG. 1. Description will be now given with comparison to a process flow diagram of FIG. 3. As shown in FIG. 2, after the buffer layer 20 and the highly resistive first nitride semiconductor layer 30 are formed on the substrate 10, a masking barrier 33 is formed by patterning in order to originally block the 2DEG 35 from being formed below the gate region. (See (a) of FIG. 2) (S250) Here, the masking bather 33 is preferably made of SiO2 which is suitable to be deposited and has high insulating property.

Then, the AlGaN layer 40, which is the second nitride semiconductor layer 40, is re-grown on the source/drain region located in a side using MOCVD, with the masking barrier 33 interposed therebetween. (S350) After the masking barrier 33 is again etched away, the method enters processes after FIG. 1d. Of course, the masking barrier 33 may play a role of the gate insulating film 45 without being etched.

In this way, the method of manufacturing the nitride semiconductor device according to the embodiment of the present invention illustrated in FIG. 2 forms the insulative masking barrier 33 on the gate region above the first semiconductor layer and forms the second semiconductor layer at a side of the masking barrier 33 such that the 2DEG 35 which may occurs between the two semiconductor layers with heterojunction therebetween is partially originally blocked, thereby easily implementing the normally off nitride semiconductor device.

As described in the embodiments shown in FIGS. 1 and 2, the present invention provides a method of easily implementing a normally off enhancement semiconductor device by removing a hetero-junction layer with selective etching or the masking barrier 33 below the gate region, thereby originally blocking the 2DEG 35 which is generated by the hetero-junction between two nitride semiconductor layers having different band gaps. Thus, the present invention provides an enhancement normally off device in a HEMT device with ease, an efficient power semiconductor device with a simple driving circuit, and a method of manufacturing the same.

The steps in the inventive process are not limited by a complete time-series order but are described according to a sequence applied to the general semiconductor process in order to facilitate a understanding of the present invention. Of course, the steps in the inventive process can be modified or altered as necessary. Furthermore, the nitride semiconductor used herein means any semiconductors including nitride without being limited to the semiconductor applied in the above embodiments.

Although a few exemplary embodiments have been shown and described, it will be appreciated by those skilled in the art that adaptations and changes may be made in these exemplary embodiments without departing from the spirit and scope of the invention, the scope of which is defined in the appended claims and their equivalents.

The invention claimed is:

1. A method of manufacturing a normally off nitride semiconductor device, comprising the steps of:
    forming a buffer layer on a substrate;
    forming a first nitride semiconductor layer on the buffer layer;
    patterning a source/drain region;
    patterning a masking barrier made of $SiO_2$ in a gate region from above the first nitride semiconductor layer;
    forming a hetero junction layer below the source/drain region by forming a second nitride semiconductor layer having a band gap different from that of the first nitride semiconductor layer, the masking barrier interposed between the source region and the drain region;

removing the masking barrier;

forming an insulating film on the second nitride semiconductor layer and a layer where the masking barrier is removed;

patterning the source/drain region, etching the insulating film in the source/drain region, and forming electrodes in the source/drain region; and forming a gate electrode on the insulating film in the gate region.

2. The method of claim 1, wherein the first nitride semiconductor layer is a highly resistive GaN layer.

3. The method of claim 1, wherein the second nitride semiconductor layer is an AlGaN layer.

4. The method of claim 1, wherein the first nitride semiconductor layer and the second nitride semiconductor layer are formed using a MOCVD method.

5. The method of claim 1, wherein the insulating film is made of one selected from the group consisting of $Al_2O_3$, $HfO_2$ and $SiO_2$.

* * * * *